US010490256B2

(12) United States Patent
Jeong

(10) Patent No.: US 10,490,256 B2
(45) Date of Patent: Nov. 26, 2019

(54) LAYOUT OF SEMICONDUCTOR MEMORY DEVICE INCLUDING SUB WORDLINE DRIVER

(71) Applicant: SK hynix Inc., Icheon-si Gyeonggi-do (KR)

(72) Inventor: Jae Hong Jeong, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 42 days.

(21) Appl. No.: 15/631,855

(22) Filed: Jun. 23, 2017

(65) Prior Publication Data

US 2018/0166119 A1 Jun. 14, 2018

(30) Foreign Application Priority Data

Dec. 14, 2016 (KR) ........................ 10-2016-0170644

(51) Int. Cl.
| | |
|---|---|
| G11C 11/408 | (2006.01) |
| G11C 8/08 | (2006.01) |
| G11C 8/14 | (2006.01) |
| G11C 5/02 | (2006.01) |
| G11C 5/06 | (2006.01) |

(52) U.S. Cl.
CPC ............ *G11C 11/4085* (2013.01); *G11C 5/02* (2013.01); *G11C 5/025* (2013.01); *G11C 5/06* (2013.01); *G11C 5/063* (2013.01); *G11C 8/08* (2013.01); *G11C 8/14* (2013.01); *G11C 11/408* (2013.01)

(58) Field of Classification Search
CPC ..... G11C 11/4085; G11C 5/063; G11C 5/025; G11C 11/408
See application file for complete search history.

(56) References Cited

U.S. PATENT DOCUMENTS

| 5,862,098 | A | * | 1/1999 | Jeong | ........................ | G11C 8/14 |
|---|---|---|---|---|---|---|
| | | | | | | 365/230.06 |
| 6,052,301 | A | | 4/2000 | Ikeda et al. | | |
| 9,318,175 | B1 | * | 4/2016 | Chi | ........................ | G11C 5/063 |
| 9,583,152 | B1 | * | 2/2017 | Jeong | ..................... | G11C 5/025 |
| 2001/0013659 | A1 | * | 8/2001 | Noda | ........................ | G11C 7/18 |
| | | | | | | 257/758 |
| 2002/0109194 | A1 | * | 8/2002 | Ishizuka | ........... | H01L 21/28123 |
| | | | | | | 257/368 |
| 2002/0140015 | A1 | * | 10/2002 | Kitsukawa | ............. | G11C 5/025 |
| | | | | | | 257/296 |
| 2006/0163613 | A1 | * | 7/2006 | Chang | ................. | H01L 27/0207 |
| | | | | | | 257/202 |
| 2007/0096156 | A1 | * | 5/2007 | Fujisawa | ................ | G11C 5/025 |
| | | | | | | 257/208 |
| 2015/0380416 | A1 | | 12/2015 | Saino | | |
| 2017/0005096 | A1 | * | 1/2017 | Lee | ........................ | H01L 27/092 |

FOREIGN PATENT DOCUMENTS

| KR | 100316619 B1 | 12/2001 |
|---|---|---|
| KR | 1020150119286 A | 10/2015 |

* cited by examiner

*Primary Examiner* — Mushfique Siddique
(74) *Attorney, Agent, or Firm* — William Park & Associates Ltd.

(57) ABSTRACT

A layout structure of a sub word line driver for use in a semiconductor memory device is disclosed. The sub word line driver may include a first active region through which first and second main word lines pass. The sub word line driver may include first gates arranged in the first active region, and configured to receive word line selection signals. Each of the first gates is formed to have a substantially square shape.

7 Claims, 9 Drawing Sheets

US 10,490,256 B2

LAYOUT OF SEMICONDUCTOR MEMORY DEVICE INCLUDING SUB WORDLINE DRIVER

CROSS-REFERENCE TO RELATED APPLICATION

The priority of Korean patent application No. 10-2016-0170644 filed on Dec. 14, 2016, the disclosure of which is hereby incorporated in its entirety by reference, is claimed.

BACKGROUND

1. Technical Field

Embodiments of the present disclosure may generally relate to a sub word line driver of a semiconductor memory device, and more particularly to a layout of a sub word line driver.

2. Related Art

Generally, a semiconductor memory device consists of a plurality of memory cells and a circuit for controlling the memory cells.

FIG. 1 is a conceptual diagram illustrating an arrangement structure of cell mats MATs for use in a general semiconductor memory device. FIG. 2 is a conceptual diagram illustrating word lines WL arranged in the cell mats MATs.

Referring to FIG. 1, the semiconductor memory device consists of a plurality of mats MATs, each of which has array-shaped memory cells for storing data. Each mat MAT consists of a bit-line sense amplifier BLSA arranged in a row direction to sense/amplify cell data, and a plurality of sub word line drivers SWD arranged in a column direction to enable sub word lines coupled to gates of cell transistors.

Referring to FIG. 2, the respective sub word line drivers SWD may operate word lines WL of the right and left cell mats MAT.

SUMMARY

In accordance with an aspect of the present disclosure, a sub word line driver of a semiconductor memory device may be provided. The sub word line driver may include a first active region through which first and second main word lines pass. The sub word line driver may include first gates arranged in the first active region, and configured to receive word line selection signals.

The first active region may include a first partial active region having both ends through which the first main word line and the second main word line respectively pass; a second partial active region adjacent to and symmetrical to the first partial active region, and formed to have both ends through which the first main word line and the second main word line respectively pass; and a third partial active region formed to couple a center part of the first partial active region to a center part of the second partial active region.

The first gates may include a first selection gate disposed to overlap the center part of the first partial active region and one end of the third partial active region; and a second selection gate disposed to overlap the center part of the second partial active region and the other end of the third partial active region.

The sub word line driver may include a first contact disposed between the first main word line and the first selection gate in the first partial active region, and coupled to a first sub word line; a second contact disposed between the second main word line and the first selection gate in the first partial active region, and coupled to a second sub word line; a third contact disposed between the first main word line and the second selection gate in the second partial active region, and coupled to a third sub word line; and a fourth contact disposed between the second main word line and the second selection gate in the second partial active region, and coupled to a fourth sub word line.

The sub word line driver may include a fifth contact disposed between the first selection gate and the second selection gate in the third partial active region, and coupled with a back bias voltage.

The first partial active region is formed in substantially a '⌐' shape, and he second partial active region is formed in substantially a '⌐' shape.

The sub word line driver may further include a second active region disposed adjacent to the first active region in the first direction, and formed to allow the first and second main word lines to pass therethrough; and second gates arranged in the second active region between the first main word line and the second main word line, and configured to receive word line selection signals, wherein each of the second gates is formed to have a substantially square shape.

The second active region may include a fourth partial active region having both ends through which the first main word line and the second main word line respectively pass; a fifth partial active region adjacent to and symmetrical to the fourth partial active region, and formed to have both ends through which the first main word line and the second main word line respectively pass; and a sixth partial active region formed to couple a center part of the fourth partial active region to a center part of the fifth partial active region.

The second gates may include a third selection gate disposed to overlap the center part of the fourth partial active region and one end of the sixth partial active region; and a fourth selection gate disposed to overlap the center part of the fifth partial active region and the other end of the sixth partial active region.

The sub word line driver may further include a sixth contact disposed between the first main word line and the third selection gate in the fourth partial active region, and coupled to a fifth sub word line; a seventh contact disposed between the second main word line and the third selection gate in the fourth partial active region, and coupled to a sixth sub word line; an eighth contact disposed between the first main word line and the fourth selection gate in the fifth partial active region, and coupled to a seventh sub word line; and a ninth contact disposed between the second main word line and the fourth selection gate in the fifth partial active region, and coupled to an eighth sub word line.

The sub word line driver may further include a tenth contact disposed between the third selection gate and the fourth selection gate in the sixth partial active region, and coupled with a back bias voltage.

The sub word line driver may further include a second active region disposed adjacent to the first active region in the first direction, and formed to allow the first and second main word lines to pass therethrough; and second gates arranged in outside ends of the first and second main word lines in the second active region, and configured to receive word line selection signals, wherein each of the second gates is formed to have a substantially square shape, and a spacing between the first main word line and the second main word line within the second active region is smaller in size than a spacing between the first main word line and the second main word line within the first active region.

The second active region may include a fourth partial active region having a center part through which the first main word line and the second main word line pass; a fifth partial active region adjacent to and symmetrical to the fourth partial active region, and formed to have a center part through which the first main word line and the second main word line pass; a sixth partial active region formed to couple a center part of the fourth partial active region to a center part of the fifth partial active region; a seventh partial active region formed to couple a first end of the fourth partial active region and a first end of the fifth partial active region; and an eighth partial active region through formed to couple a second end of the fourth partial active region and a second end of the fifth partial active region.

The second gates may include a third selection gate disposed to overlap one end of the fourth partial active region and one end of the seventh partial active region; a fourth selection gate disposed to overlap the other end of the fourth partial active region and one end of the eighth partial active region; a fifth selection gate disposed to overlap one end of the fifth partial active region and the other end of the seventh partial active region; and a sixth selection gate disposed to overlap the other end of the fifth partial active region and the other end of the eighth partial active region.

The sub word line driver may further include a fifth contact disposed between the first main word line and the third selection gate in the fourth partial active region, and coupled to a fifth sub word line; a sixth contact disposed between the second main word line and the fourth selection gate in the fourth partial active region, and coupled to a sixth sub word line; a seventh contact disposed between the first main word line and the fifth selection gate in the fifth partial active region, and coupled to a seventh sub word line; and an eighth contact disposed between the second main word line and the sixth selection gate in the fifth partial active region, and coupled to an eighth sub word line.

The sub word line driver may further include a ninth and tenth contacts disposed between the first and second main word lines in the sixth partial active region, and both coupled to a back bias voltage.

The third selection gate and the fourth selection gate are configured to receive the same word line selection signal; and the fifth selection gate and the sixth selection gate are configured to receive the same word line selection signal.

The first active region may include a first partial active region formed in a shape that one side of a square-belt-shaped structure is partially opened in a manner that the first main word line passes through the first partial active region; a second partial active region adjacent to the first partial active region in a second direction perpendicular to the first direction, formed in a shape that one side of a square-belt-shaped structure is partially opened in a manner that the second main word line passes through the second partial active region; and a third partial active region disposed between the first partial active region and the second partial active region, and formed to couple the first partial active region to the second partial active region.

The first gates may include a first selection gate and a second selection gate respectively located at both sides of the third partial active region in such a manner that the first selection gate and the second selection gate pass through some parts of the first partial active region and the second partial active region.

The sub word line driver may further include a first contact disposed between the first and second selection gates in the third partial active region, and coupled to a back bias voltage.

A second active region disposed adjacent to the first active region in the first direction, and formed to allow the first and second main word lines to pass therethrough; and second gates arranged in the second active region between the first main word line and the second main word line, and configured to receive word line selection signals, wherein each of the second gates is formed in a substantially square shape.

The second active region may include a fourth partial active region formed in a shape that one side of a square-belt-shaped structure is partially opened in a manner that the first main word line passes through the fourth partial active region; a fifth partial active region adjacent to the fourth partial active region in the second direction, and formed in a shape that one side of a square-belt-shaped structure is partially opened in a manner that the second main word line passes through the fifth partial active region; and a sixth partial active region disposed between the fourth partial active region and the fifth partial active region, and formed to couple the fourth partial active region to the fifth d partial active region.

The second gates may include a third selection gate and a fourth selection gate respectively located at both sides of the sixth partial active region in a manner that the third selection gate and the fourth selection gate pass through some parts of the fourth partial active region and the fourth partial active region.

The sub word line driver may further include a second contact disposed between the third and fourth selection gates in the third partial active region, and coupled to a back bias voltage.

The sub word line driver may further include a second active region disposed adjacent to the first active region in the first direction, and formed to allow the first and second main word lines to pass therethrough; and second gates arranged at outside ends of the first main word line and the second main word line within the second active region, and configured to receive word line selection signals, wherein each of the second gates is formed in a substantially square shape, and a spacing between the first main word line and the second main word line within the second active region is smaller in size than a spacing between the first main word line and the second main word line within the first active region.

The first active region may be located within an NMOS region and be formed in an 'H' shape region in which two contiguous active regions of the first active region are coupled to each other.

DETAILED DESCRIPTION

Reference will now be made to certain embodiments, examples of which are illustrated in the accompanying drawings. Wherever possible, the same reference numbers will be used throughout the drawings to refer to the same or like parts. In the following description, a description of related known configurations or functions incorporated herein will be omitted when it may make the subject matter less clear.

Various embodiments of the present disclosure may be directed to providing a sub word line driver of a semiconductor memory device that substantially obviates one or more problems due to limitations and disadvantages of the related art.

Figure 1:
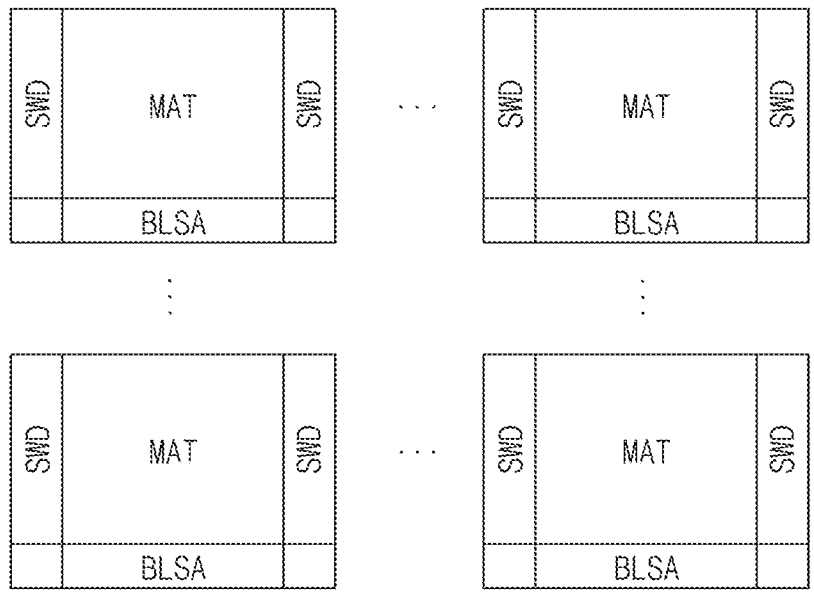
FIG. 1 is a conceptual diagram illustrating an arrangement structure of cell mats MAT for use in a general semiconductor memory device.
Figure 2:
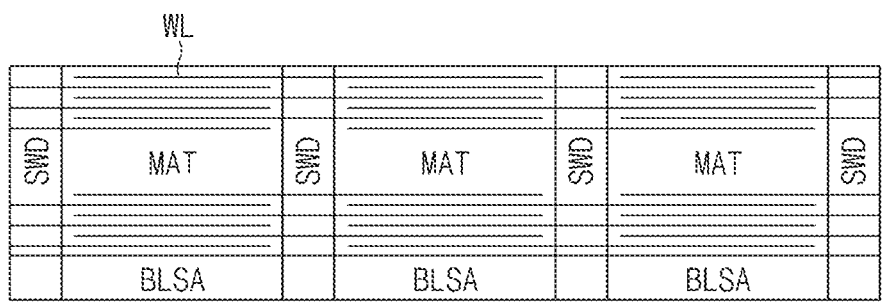
FIG. 2 is a conceptual diagram illustrating sub word lines SWL arranged in the cell mats MAT.
Figure 3:
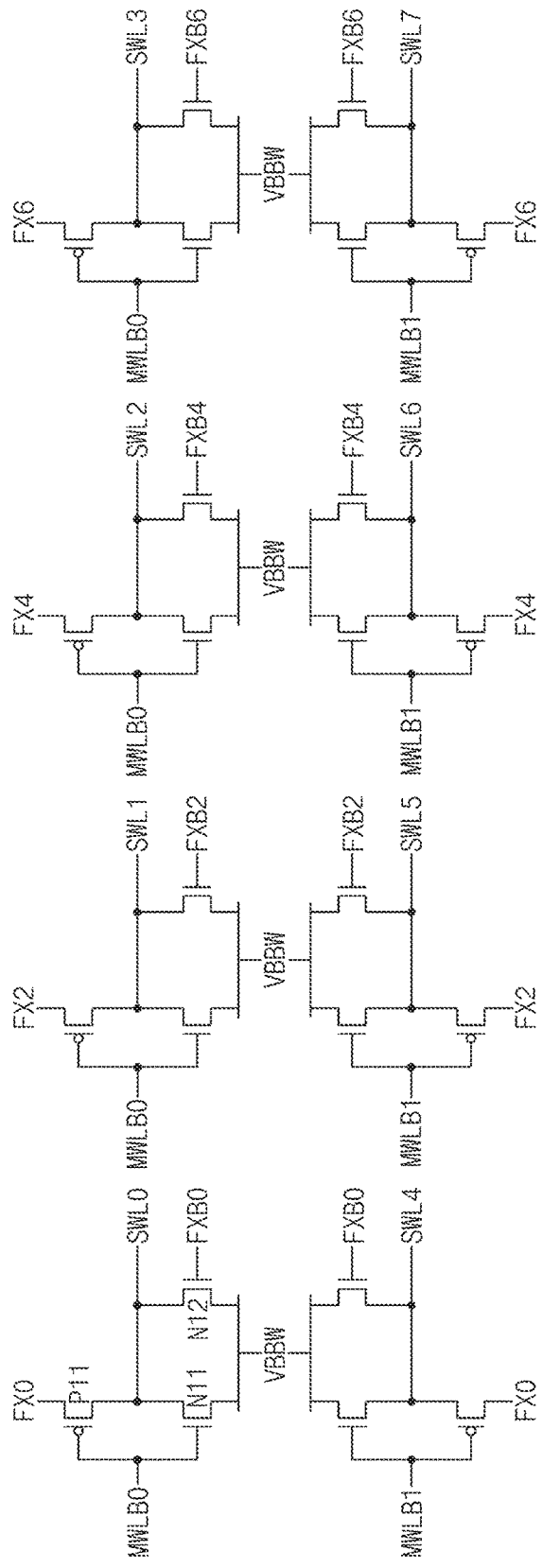
FIG. 3 is a circuit diagram illustrating a sub word line driver.

FIG. 3 is a circuit diagram illustrating a representation of an example of a sub word line driver.

Referring to FIG. 3, the sub word line driver is formed in a sub word line driver array shape which respectively outputs the sub word line drive signals SWL0 to SWL3 and SWL4 to SWL7 in response to main word line drive signals MWBL0 and MWLB1 and word line selection signals FX0, FX2, FX4, and FX6. The respective sub word line drivers may have the same structure in the remaining parts other than input and output (input/output) (I/O) signals.

Representatively, the structure of the respective sub word line drivers will hereinafter be described using a sub word line driver of a first stage.

Each sub word line driver may include a PMOS transistor (i.e., P11 . . . ) and NMOS transistors (i.e., N11 and N12 . . . ). The PMOS transistor P11 and the NMOS transistor N11 may be coupled in series between an input terminal of a word line selection signal (i.e., FX0 . . . ) and an input terminal of a back-bias voltage VBBW (or ground voltage VSS), and may receive a main word line drive signal MWBL0 through a common gate terminal. The NMOS transistor (i.e., N12 . . . ) may be coupled in series between an output terminal of a sub word line drive signal (i.e., SWL0 . . . ) and the back-bias voltage VBBW (or ground voltage VSS) input terminal, and may receive an inversion signal (i.e., FXB0 . . . ) of the word line selection signal (i.e., FX0 . . . ) through a gate terminal thereof.

In an above-mentioned structure, a regional gain gradually may increase in proportion to the increasing size of the sub word line driver, such that a minimum-sized sub word line driver must be arranged in the semiconductor memory device. To this end, the sub word line drivers may be arranged according to the pitch of sub word lines.

However, as semiconductor memory devices become highly integrated, the pitch of sub word lines may be gradually reduced and a space margin between a metal contact M0C and a gate may also be gradually reduced, such that a not-open phenomenon in which a contact is incompletely opened may occur. For example, the not-open phenomenon may cause a serious problem in an NMOS region in which many more transistors than in the PMOS region need to be formed.

Thus, an embodiment of the present disclosure may relate to a sub word line driver for minimizing the increase of the region of a sub word line driver by improving a structure of the sub word line, thus obtaining a space margin between a metal contact and a gate line.

Figure 4:
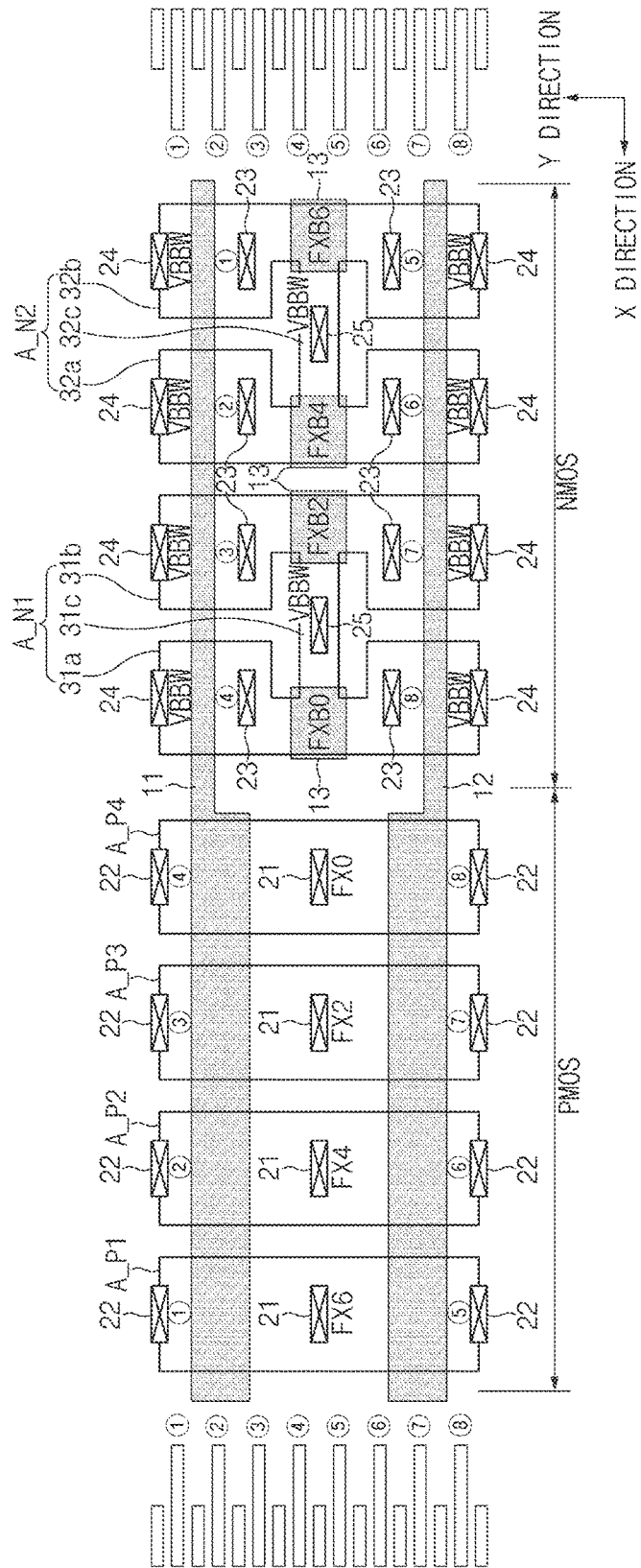
FIG. 4 is a structural diagram illustrating a representation of an example of a layout structure of a sub word line driver according to an embodiment of the present disclosure.

For example, FIG. 4 is a structural diagram illustrating a representation of an example of a layout structure of a sub word line driver according to an embodiment of the present disclosure. FIG. 4 is a layout structure of the sub word line driver illustrated in FIG. 3.

Referring to FIG. 4, the sub word line is classified into a PMOS region and an NMOS region, and a plurality of active regions A_P1 to A_P4 may be arranged in the PMOS region and a plurality of active regions A_N1 and A_N2 may be arranged in the NMOS region. In this case, bar-shaped active regions A_P1 to A_P4 of the PMOS region may be spaced apart from each other at intervals of a predetermined distance. Each of the active regions A_N1 and A_N2 of the NMOS region may be formed in an "H"-shape region in which the center parts of two contiguous active regions are coupled to each other.

Two main word lines 11 and 12 arranged in a first direction (X-axis direction) may be arranged over the active regions A_P1 to A_P4 of the PMOS region and the active regions A_N1 and A_N2 of the NMOS region. In this case, the main word lines 11 and 12 may be formed to have different line widths in the PMOS region then in the NMOS region. For example, in the respective main word lines 11 and 12, a line width of one part passing through the active regions A_P1 to A_P4 of the PMOS region may be larger than a line width of the other part passing through the active regions A_N1 and A_N2 of the NMOS region.

In the main word lines 11 and 12, a part formed to overlap the active regions A_P1 to A_P4, A_N1, and A_N2 may be used as a gate for receiving the main word line drive signals MWBL0 and MWLB1 in the sub word line driver of FIG. 3.

In the active regions A_P1 to A_P4 of the PMOS region, metal contacts 21 configured to receive word line selection signals FX0, FX2, FX4, and FX6 and metal contacts 22 coupled to sub word lines ① to ⑧ may be respectively located at both sides of the main word lines 11 and 12. That is, the metal contacts 21 may be located at the center part of the active regions A_P1 to A_P4. The metal contacts 22 may be respectively located at the outside parts of the main word lines 11 and 12. In other words, the metal contacts 22 may be respectively located at both ends of the active regions A_P1 to A_P4.

In the NMOS region, each of the active regions A_N1 and A_N2 may be formed in an "H"-shaped region in which the center parts of two contiguous active regions arranged in a first direction are coupled to each other. For example, the active region A_N1 may include active regions 31*a* and 31*b* disposed symmetrically and contiguously and an active region 31*c* coupled to the center parts of the active regions 31*a* and 31*b*. Although an embodiment has, for example, disclosed different active regions 31*a* to 31*c* isolated from one another for convenience of description and better understanding of the present disclosure, the active regions 31*a* to 31*c* may be integrated into a single active region A_N1. In other words, the active regions 31*a* to 31*c* may be partial active regions constructing the active region A_N1.

The active region A_N2 may be identical in structure to the active region A_N1. In other words, the active region A_N2 may include symmetrical and adjacent active regions 32*a* and 32*b*, and an active region 32*c* formed to interconnect the center parts of the active regions 32*a* and 32*b*.

In this case, each of the active regions 31*a*, 31*b*, 32*a*, and 32*b* may be formed in a "⌐"-shaped region in which a part corresponding to both ends (i.e., a part through which the main word lines 11 and 12 pass) is larger in width than a center part.

In the active regions A_N1 and A_N2 of the NMOS region, four selection gates 13 configured to respectively receive word line selection signals FXB0, FXB2, FXB4, and FXB6 may be disposed between the main word lines 11 and 12. For example, the selection gates 13 may be disposed at the coupling parts of the active regions (31*a*, 31*b*, 32*a*, 32*b*) and the active regions (31*c*, 32*c*). In this case, each of the selection gates 13 may be formed in a substantially square structure that overlaps the center parts of the active regions 31*a* and 31*b* and the end part of the active region 31*c*. For example, in each selection gate 13, the length of a first-directional side (i.e., X-directional side) may be longer than a first-directional line width of the center part of each of the active regions 31*a*, 31*b*, 32*a*, and 32*b*, and the length of a second-directional side (i.e., Y-directional side) may be longer than a second-directional line width of each of the active regions 31*c* and 32*c*. Here, it may be preferable that each selection gate 13 be formed to have a minimum-sized region.

In the active regions 31*a*, 31*b*, 32*a*, and 32*b*, metal contacts 23 coupled to sub word lines ④ to ⑧ and metal contacts 24 coupled to the back-bias voltage VBBW are respectively disposed at both sides of the main word lines 11 and 12. That is, the metal contacts 23 may be respectively located in the active regions 31*a*, 31*b*, 32*a*, and 32*b* disposed between the selection gate 13 and the main word lines 11 and 12. The metal contacts 24 from among the metal contacts 24 and 25 coupled to the back-bias voltage VBBW may be respectively disposed at the active regions 31*a*, 31*b*, 32*a*, and 32*b* located outside the main word lines 11 and 12, and the metal contacts 25 may be respectively located in the active regions 31*c* and 32*c* disposed between the gates 13. Therefore, a "T"-shaped channel may be formed between the metal contact 23 and the other metal contacts 25 by the selection gate 13. Through the above-mentioned structure, the gates 13 may interconnect different sub word lines driven by different main word lines 11 and 12 through the word line selection signals FXB0, FXB2, FXB4, and FXB6, such that the gates 13 may be equalized to the back-bias voltage (VBBW) level.

Figure 5:
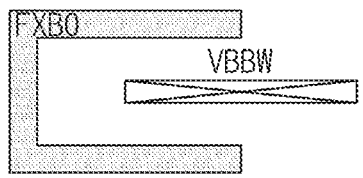
FIG. 5 is a conceptual diagram illustrating a representation of an example of a "⊑"-shaped gate configured to receive a word line selection signal.

As described above, each of the selection gates 13 illustrated in FIG. 4 is formed in a substantially square structure. Compared with the structure of FIG. 5 in which the gate receiving each word line selection signal FXB0, FXB2, FXB4, or FXB6 is formed in the "⊏"-shaped structure and the formation range of each contact extends to the inside of the corresponding gate, the length of the Y-directional side of the selection gate 13 is greatly reduced, such that the formation space of the metal contacts 23 within the active regions 31*a*, 31*b*, 32*a*, and 32*b* may be increased in size. As a result, the space margin between the metal contact 23 and the gates 11, 12, and 13 may be guaranteed.

Figure 6:
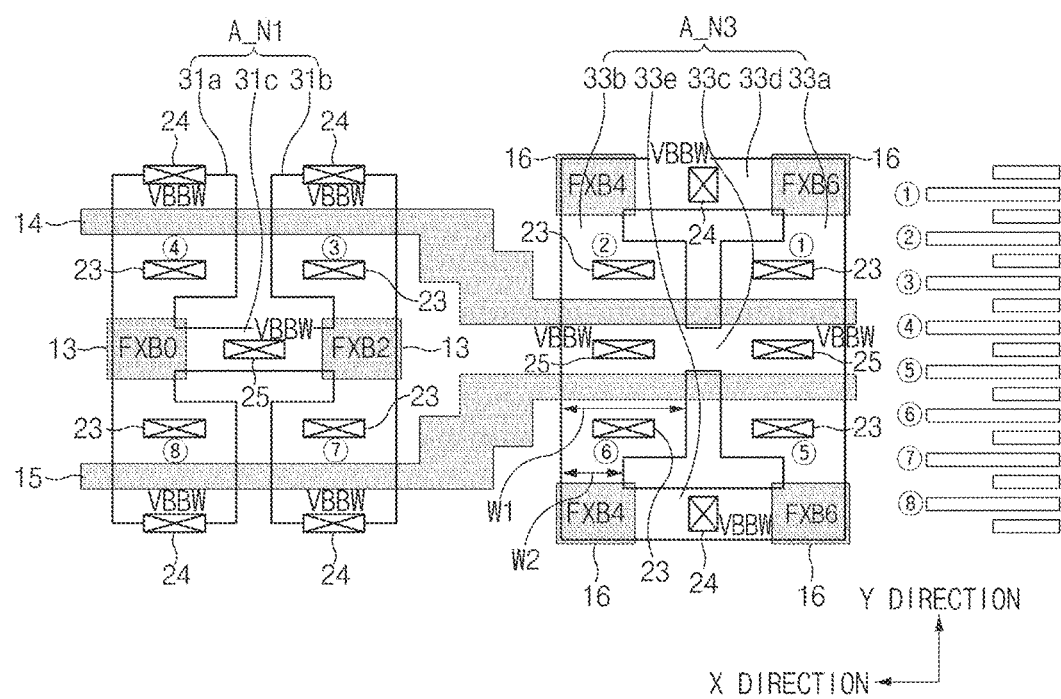
FIG. 6 is a structural diagram illustrating a representation of an example of a layout structure of a sub word line driver according to an embodiment of the present disclosure.

FIG. 6 is a structural diagram illustrating a layout structure of a sub word line driver according to an embodiment of the present disclosure. Compared with the structure of FIG. 4, only the NMOS region of FIG. 6 may be slightly modified in structure, and the remaining parts other than the NMOS region are identical to those of FIG. 4. Therefore, for convenience of description and better understanding of the present disclosure, the PMOS region is omitted from FIG. 6, and only the NMOS region is illustrated in FIG. 6.

In the NMOS region of an embodiment illustrated in FIG. 6, a region configured to receive the word line selection signals FXB0 and FXB2 is identical in structure to the corresponding region of FIG. 4. However, in the region for receiving the word line selection signals FXB4 and FXB6, the structure of the active region A_N3, the position of the selection gates 16 configured to receive the word line selection signals FXB4 and FXB6, and the position of the main word lines 14 and 15 illustrated in FIG. 6 may be different from those of FIG. 4.

In the region for receiving the word line selection signals FXB4 and FXB6, the center part of two contiguous active regions arranged in the first direction within the active region A_N3 may be coupled to both ends of the active region A_N3. For example, the active region A_N3 may be formed in a manner that the center parts of two contiguous active regions 33*a* and 33*b* and both ends of the two contiguous active regions 33*a* and 33*b* are interconnected through the active regions 33*c*, 33*d*, and 33*e*. Although an above-mentioned embodiment has, for example, disclosed that the active regions 33*a* to 33*e* are isolated from one another for convenience of description and better understanding of the present disclosure, it should be noted that the active regions 33*a* to 33*e* may also be integrated into a single active region as necessary.

In the active region A_N3, the main word lines 14 and 15 may be arranged to pass through the spacing between the contacts 23 and 25 on the basis of the active region 33*c* interposed therebetween. That is, although the main word lines 14 and 15 of the active region A_N1 are arranged to pass through the active region disposed between both ends (e.g., the contacts 23 and 24) of the active region A_N1, the main word lines 14 and 15 of the active region A_N3 are arranged to pass through the center part of the active region A_N3 (e.g., the active region disposed between the contacts 23 and 25). Therefore, in the active regions 33*a* and 33*b*, the center part through which the main word lines 14 and 15 pass may have a larger width W1 than a width W2 of each of both ends.

From among the selection gates 16 configured to receive the word line selection signals FXB4 and FXB6, two selection gates 16 may be arranged outside the main word line 14, and other two selection gates 16 may be arranged outside the other main word line 15. In this case, the selection gates 16 may be respectively arranged at the coupling parts of the active regions 33*a* and 33*b* and the other active regions 33*d* and 33*e*, and may be formed in square shapes covering the end parts of the active regions 33*a*, 33*b*, 33*d*, and 33*e*.

The metal contacts coupled to the back-bias voltage VBBW may be located not only in the active regions 33*a* and 33*b* disposed between the main word lines 14 and 15, but also in the active regions 33*d* and 33*e* disposed between the selection gates 16. The metal contacts coupled to the sub word lines 1, 2, 5, and 6 may be respectively arranged in the active regions 33*a* and 33*b* located among the main word lines 14 and 15 and the selection gates 16.

Figure 7:
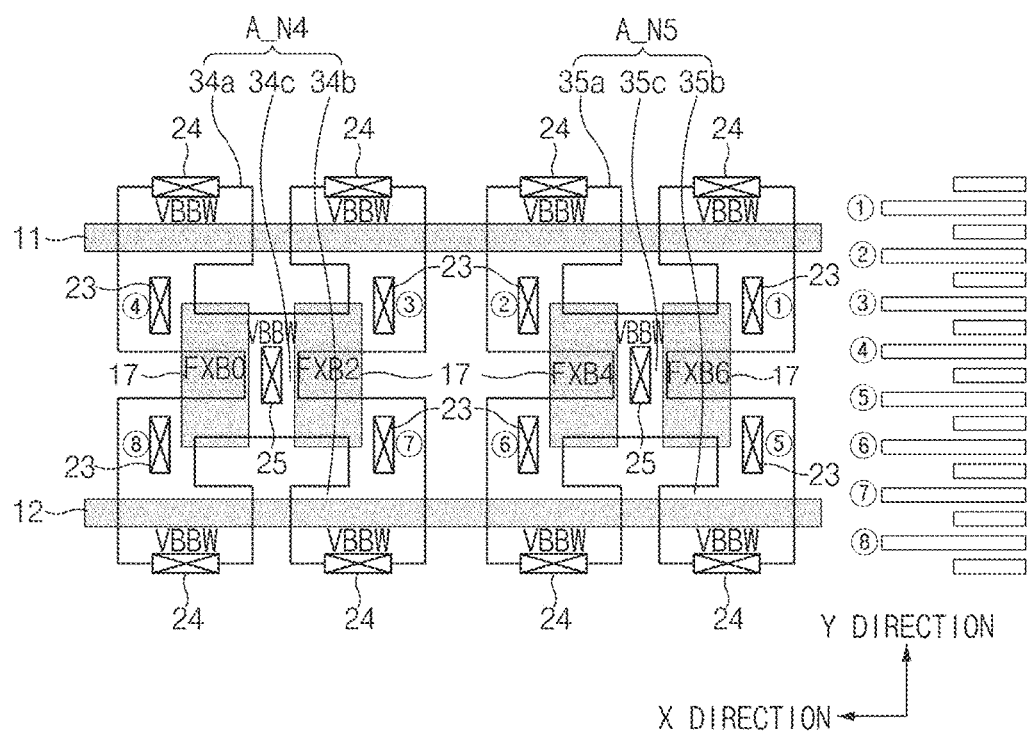
FIG. 7 is a structural diagram illustrating a representation of an example of a layout structure of a sub word line driver according to an embodiment of the present disclosure.

FIG. 7 is a structural diagram illustrating a layout structure of a sub word line driver according to an embodiment of the present disclosure. FIG. 7 illustrates only the NMOS region. In other words, the PMOS region of FIG. 7 may be identical in structure to the PMOS region of FIG. 4, and as such a description of the PMOS region will herein be omitted from FIG. 7.

Referring to FIG. 7, the NMOS region may include the active regions A_N4 and A_N5 located adjacent to each other in the first direction (X-axis direction), and the main word lines 11 and 12 arranged in the first direction may be disposed over the active regions A_N4 and A_N5.

Four selection gates 17 configured to respectively receive the word line selection signals FXB0, FXB2, FXB4, and FXB6 may be arranged over the active regions A_N4 and A_N5 disposed between the main word lines 11 and 12. In this case, each of the selection gates 17 may be formed in a square shape extending to the second direction (Y-axis direction) substantially perpendicular to the direction (i.e., the first direction) of the main word lines 11 and 12.

The active region A_N4 may include active regions 34*a* and 34*b* which are adjacent to each other in the second direction and are formed in a shape that one side of a square-belt-shaped structure is partially opened; and the other active region 34*c* through which the active regions 34*a* and 34*b* are connected to each other. Likewise, the active region A_N5 may also include active regions 35*a* and 35*b* which are adjacent to each other in the second direction and are formed in a manner that one side of a square-belt-shaped structure is partially opened; and the other active region 35*c* through which the active regions 35*a* and 35*b* are connected to each other.

The main word line 11 may be arranged to pass through the active regions 34*a* and 35*a*, and the main word line 12 may be arranged to pass through the active regions 34*b* and 35*b*. The selection gates 17 may be located at both sides of the active regions 34*c* and 35*c*, and may be arranged to pass through some of the active regions 34*a* and 34*b* and some of the active regions 35*a* and 35*b*.

In the active regions 34*a*, 34*b*, 35*a*, and 35*b*, the metal contacts 23 coupled to the sub word lines 1 to 8 and the contacts 24 coupled to the back-bias voltage VBBW may be located at both sides of the main word lines 11 and 12, respectively. The metal contact 25 coupled to the back-bias voltage VBBW may be located in each of the active regions 33*c* and 34*c* disposed between the selection gates 17.

Figure 8:
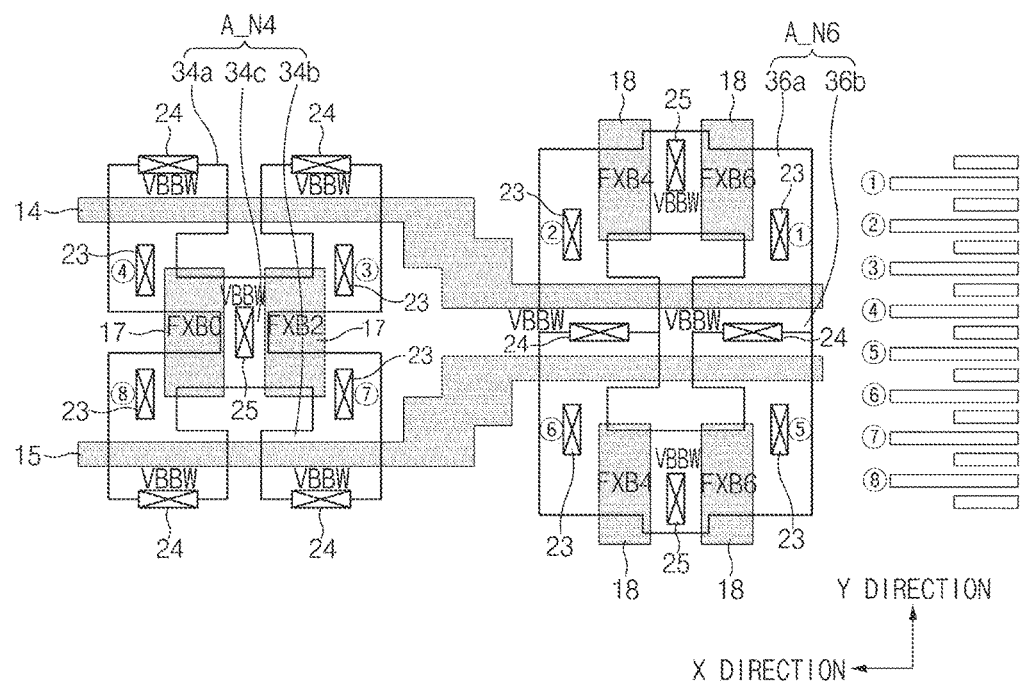
FIG. 8 is a structural diagram illustrating a representation of an example of a layout structure of a sub word line driver according to an embodiment of the present disclosure.

FIG. 8 is a structural diagram illustrating a layout structure of a sub word line driver according to an embodiment of the present disclosure. Compared with the structure of FIG. 7, the region configured to receive the word line selection signals FXB4 and FXB6 may be modified and is illustrated in FIG. 8.

As can be seen from the NMOS region of an embodiment illustrated in FIG. 8, the region configured to receive the word line selection signals FXB0 and FXB2 may be identical in structure to the region of FIG. 7. However, as can be seen from the region receiving the word line selection signals FXB4 and FXB6 illustrated in FIG. 8, the structure of the active region A_N6, the position of the selection gates 18 receiving the word line selection signals FXB4 and FXB6, and the position of the main word lines 14 and 15 are different from those of FIG. 7.

For example, the active region A_N6 may include active regions 36*a* and 36*b* formed to contact each other in a symmetrical manner. For example, the active regions 36*a* and 36*b* are formed in a shape that one side of a square-belt-shaped structure is partially opened and the partially opened sides of the active regions 36*a* and 36*b* are formed to contact each other. Therefore, in the active region A_N6, the metal contacts 24 having been located at both ends of the active region A_N4 may be located at the center part of the active region A_N6, the main word line 14 may pass through the space between the metal contacts 23 and 24 of the active region 36*a*, and the other main word line 15 may pass through the space between the metal contacts 23 and 24 of the active region 36*b*.

From among the selection gates 18 configured to receive the word line selection signals FXB4 and FXB6, two selection gates 18 may be arranged in the active regions 36*a* and 36*b* located outside the main word line 14, and other two selection gates 18 may be arranged in the active regions 36*a* and 36*b* located outside the main word line 15. Metal contacts coupled to the sub word lines 1, 2, 5, and 6 and metal contacts coupled to the back-bias voltage VBBW may be respectively located at both sides of the selection gates 18.

As is apparent from the above description, the sub word line driver of the semiconductor memory device according to the embodiments of the present disclosure can minimize the increase of the region of a sub word line driver by improving a structure of the sub word line, thus obtaining a space margin between a metal contact and a gate line.

Figure 9:
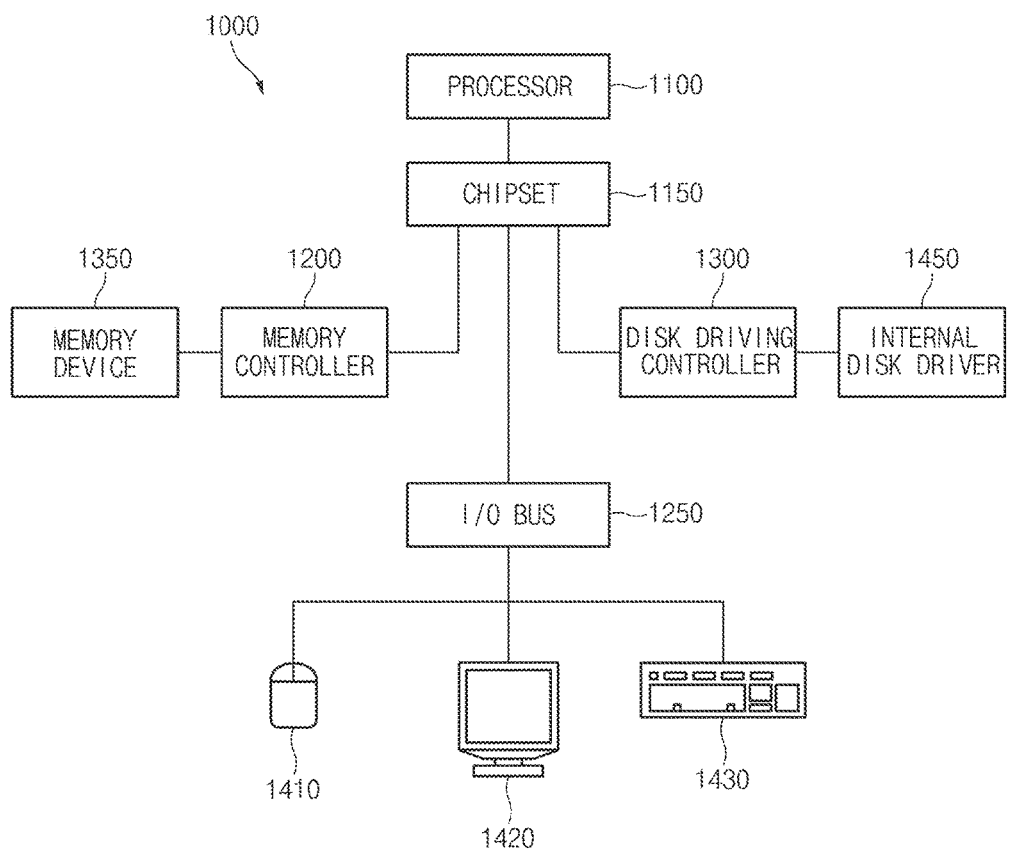
FIG. 9 illustrates a block diagram of an example of a representation of a system employing a semiconductor device and or sub word line driver with the various embodiments discussed above with relation to FIGS. 4-8.

The semiconductor devices and or sub word line drivers as discussed above (see FIGS. 4-8) are particular useful in the design of other memory devices, processors, and computer systems. For example, referring to FIG. 9, a block diagram of a system employing a semiconductor device and or sub word line driver in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or sub word line driver as discussed above with reference to FIGS. 4-8. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or sub word line driver as discussed above with relation to FIGS. 4-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 9 is merely one example of a semiconductor device and or sub word line driver as discussed above with relation to FIGS. 4-8. In alternate embodiments, such as, for example but not limited to, cellular phones or digital cameras, the components may differ from the embodiments illustrated in FIG. 9.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor are the embodiments limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A sub word line driver of a semiconductor memory device comprising:
    a first active region through which first and second main word lines extending in a first direction pass; and
    first gates arranged in the first active region disposed between the first main word line and the second main word line, and configured to receive word line selection signals,
    wherein each of the first gates is formed to have a substantially square shape.

2. The sub word line driver according to claim 1, wherein the first active region includes:
    a first partial active region having both ends through which the first main word line and the second main word line respectively pass;
    a second partial active region adjacent to and symmetrical to the first partial active region, and formed to have both ends through which the first main word line and the second main word line respectively pass; and
    a third partial active region formed to couple a center part of the first partial active region to a center part of the second partial active region.

3. The sub word line driver according to claim 2, wherein the first gates includes:
    a first selection gate disposed to overlap the center part of the first partial active region and one end of the third partial active region; and
    a second selection gate disposed to overlap the center part of the second partial active region and the other end of the third partial active region.

4. The sub word line driver according to claim 2, wherein:
    in each of the first partial active region and the second partial active region, both ends are larger in width than a center part.

5. The sub word line driver according to claim 2, further comprising:
    a second active region disposed adjacent to the first active region in the first direction, and formed to allow the first and second main word lines to pass therethrough; and
    second gates arranged in the second active region between the first main word line and the second main word line, and configured to receive word line selection signals,
    wherein each of the second gates is formed to have a substantially square shape.

6. The sub word line driver according to claim 5, wherein the second active region includes:
    a fourth partial active region having both ends through which the first main word line and the second main word line respectively pass;
    a fifth partial active region adjacent to and symmetrical to the fourth partial active region, and formed to have both ends through which the first main word line and the second main word line respectively pass; and
    a sixth partial active region formed to couple a center part of the fourth partial active region to a center part of the fifth partial active region.

7. The sub word line driver according to claim 6, wherein the second gates includes:
    a third selection gate disposed to overlap the center part of the fourth partial active region and one end of the sixth partial active region; and
    a fourth selection gate disposed to overlap the center part of the fifth partial active region and the other end of the sixth partial active region.

* * * * *